United States Patent
Yang et al.

(10) Patent No.: US 10,224,381 B2
(45) Date of Patent: Mar. 5, 2019

(54) OLED DISPLAY DEVICE WITH THIN FILM BATTERY

(71) Applicants: BOE Technology Group Co., Ltd., Beijing (CN); Beijing BOE Optoelectronics Technology Co., Ltd., Beijing (CN)

(72) Inventors: Ming Yang, Beijing (CN); Xue Dong, Beijing (CN); Xiaochuan Chen, Beijing (CN); Pengcheng Lu, Beijing (CN); Qian Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 124 days.

(21) Appl. No.: 15/323,122

(22) PCT Filed: Mar. 4, 2016

(86) PCT No.: PCT/CN2016/075589
§ 371 (c)(1),
(2) Date: Dec. 30, 2016

(87) PCT Pub. No.: WO2016/197636
PCT Pub. Date: Dec. 15, 2016

(65) Prior Publication Data
US 2018/0145117 A1    May 24, 2018

(30) Foreign Application Priority Data
Jun. 9, 2015  (CN) .......................... 2015 1 0312156

(51) Int. Cl.
*H01L 27/32* (2006.01)
*H01M 6/40* (2006.01)
*H01M 10/0562* (2010.01)
*H01M 2/10* (2006.01)
*H01M 10/04* (2006.01)
*H01M 10/052* (2010.01)

(52) U.S. Cl.
CPC .......... *H01L 27/3225* (2013.01); *H01L 27/32* (2013.01); *H01L 27/3244* (2013.01);
(Continued)

(58) Field of Classification Search
CPC ............ H01L 27/32–27/3297; H01M 10/0562
See application file for complete search history.

(56) References Cited

U.S. PATENT DOCUMENTS

2009/0269621 A1    10/2009  Lifka et al.
2010/0065834 A1*   3/2010  Hammond ............ H01L 27/288
                                                       257/40

(Continued)

FOREIGN PATENT DOCUMENTS

CN     101226955 A     7/2008
CN     101501854 A     8/2009
(Continued)

OTHER PUBLICATIONS

Second Office Action from Chinese Patent Application No. 201510312156.8, dated Sep. 13, 2017, 8 pages.
(Continued)

*Primary Examiner* — Selim U Ahmed
*Assistant Examiner* — Evan G Clinton
(74) *Attorney, Agent, or Firm* — Westman, Champlin & Koehler, P.A.

(57) ABSTRACT

Embodiments of the present disclosure relate to an OLED display device with a thin film battery, which includes: a first substrate, a second substrate arranged to be opposite to the first substrate and an OLED device formed between the first and second substrates. The display device further includes at least one thin film battery formed on the first substrate.

11 Claims, 3 Drawing Sheets

(52) U.S. Cl.
CPC ........... *H01M 2/1066* (2013.01); *H01M 6/40* (2013.01); *H01M 10/0436* (2013.01); *H01M 10/0562* (2013.01); *H01M 10/052* (2013.01)

(56) References Cited

U.S. PATENT DOCUMENTS

| | | | | |
|---|---|---|---|---|
| 2010/0270924 | A1* | 10/2010 | Kaminska | H01L 27/3225 315/51 |
| 2011/0100458 | A1 | 5/2011 | Kang et al. | |
| 2014/0346485 | A1* | 11/2014 | Noda | H01L 51/5275 257/40 |
| 2014/0379051 | A1* | 12/2014 | Pai | A61N 5/0619 607/88 |
| 2015/0277498 | A1* | 10/2015 | Wu | G06F 1/1652 345/173 |
| 2015/0340727 | A1* | 11/2015 | Iwamoto | H01M 10/0436 429/126 |

FOREIGN PATENT DOCUMENTS

| | | |
|---|---|---|
| CN | 102593152 A | 7/2012 |
| CN | 202765457 U | 3/2013 |
| CN | 104900680 A | 9/2015 |

OTHER PUBLICATIONS

International Search Report and Written Opinion of International Application No. PCT/CN2016/075589, dated Jun. 30, 2016, 9 pages.
English translation of Box No. V of the Written Opinion for the International Searching Authority for International Application No. PCT/CN2016/075589, 1 pages.
Rejection Decision for Chinese Patent Application No. 201510312156.8, dated Dec. 5, 2017, 7 pages.
First Office Action from Chinese Patent Application No. 201510312156.8, dated May 17, 2017, 9 pages.

* cited by examiner

DRAWINGS

OLED DISPLAY DEVICE WITH THIN FILM BATTERY

CROSS-REFERENCE TO RELATED APPLICATION

This application is a 371 National Stage application of International Application No. PCT/CN2016/075589, filed on Mar. 4, 2016, which has not yet published and claims priority to Chinese Patent Application No. 201510312156.8 filed on Jun. 9, 2015 in the State Intellectual Property Office of China, the disclosure of which are incorporated herein by reference in their entirety.

BACKGROUND OF THE INVENTION

Field of the Invention

Embodiments of the present disclosure relate to display technology and especially relate to an OLED display device with a thin film battery.

Description of the Related Art

Recently, mobile devices tend to become lighter and thinner. Considering the endurance of mobile devices and electronic products, it is necessary that batteries have sufficient capacity. In this regard, thickness of the conventional battery cannot be further reduced significantly considering the capacity of the battery.

Lithium-ion batteries are developed rapidly as rechargeable batteries in recent years. The size of the battery is increased gradually as the screen size becomes larger gradually. One research direction is how to achieve reduction of the battery thickness. To this end, a thin film battery is proposed.

The thin film battery is a kind of battery developed in recent years, the notable feature of which is that the battery has a very small thickness. Therefore it can be applied to those electronic devices with strict requirements for their thickness. At present, solar batteries are commonly used in patent documents in which thin film batteries are incorporated into the display devices. Solar batteries have problems in two aspects, firstly, as a cellphone is generally used indoors, the strength of ordinary indoor light sources is not sufficient for the solar batteries to perform charging; secondly, the solar battery is a photoelectric transducer, the electric power generated by which should be supplied to a rechargeable battery. Thus, to ensure the normal operation of the display device, the display device should comprise both a solar battery and a rechargeable battery simultaneously, increasing the overall thickness of the display device.

FIG. 1 shows a schematic view of a known display device. Normally, the device comprises a display unit 1 and a rechargeable battery 2. At present, the display unit is mainly a liquid crystal display or an OLED display, and the rechargeable battery comprises a positive electrode 3 and a negative electrode 4. Before the rechargeable battery is used, it needs to be charged. At this time, it converts electrical energy into chemical energy. When the rechargeable battery is used, it converts chemical energy into electrical energy. At present, the batteries used in the display devices are generally rechargeable batteries. The rechargeable batteries mainly include nickel-cadmium batteries, nickel-hydrogen batteries, lithium-ion batteries, lead storage batteries and lithium iron batteries, among which lithium-ion batteries are a kind of rechargeable batteries commonly used in display devices because of its advantages such as a small volume, a light weight and a large capacity.

FIG. 2 shows a schematic view of another known display device, which is a type that has a solar battery. Compared with FIG. 1, the device is provided with a solar battery 5. The solar battery 5 is a device which converts solar energy into electrical energy. When the external lighting is strong enough, the solar battery works and charges the rechargeable battery. However, the display device with a solar battery has problems in two aspects, firstly, as a cellphone is generally used indoor, strength of ordinary indoor light sources is not sufficient for the solar batteries to perform charging; secondly, incorporation of the solar battery increases the overall thickness of the display device.

It should be noted that FIGS. 1 and 2 don't illustrate the specific connection manner between the battery and the display unit. This is because that in practical utilization, there may be various available connecting means or mounting means between the battery and the display device.

At present, there are some patent documents which relate to a display device with a thin film solar battery. Typically, its display unit is a liquid crystal display. In order to avoid adverse effects on the brightness of the liquid crystal display, each layer of the thin film battery should be made of transparent materials such as ITO. Further, in normal cases, when the anode and cathode are both made of transparent materials, the photoelectric conversion efficiency of the thin film solar battery is relatively low, and the use value of which is not high.

Therefore, there is a need for a kind of display device which has an improved performance of the battery, a longer endurance of electronics and an enlarged applicable area.

SUMMARY OF THE INVENTION

Embodiments of the present disclosure have been made to overcome or alleviate at least one aspect of the above mentioned disadvantages.

The object of the embodiments of the present disclosure is achieved by an OLED display device with a thin film battery proposed herein.

According to an aspect of the present disclosure, there is provided an OLED display device with a thin film battery, comprising: a first substrate, a second substrate arranged to be opposite to the first substrate, and an OLED device formed between the first and second substrates. The display device further comprises at least one thin film battery formed on the first substrate.

According to an exemplary embodiment, the thin film battery is an all-solid-state thin film battery.

According to another exemplary embodiment, the thin film battery is formed between the first substrate and the OLED device.

According to another exemplary embodiment, the thin film battery is formed on a side of the first substrate facing away from the OLED device.

According to another exemplary embodiment, the OLED device is configured such that its light emitting direction is directed toward the second substrate and the thin film battery is made of a non-transparent material, or the OLED device is configured such that its light emitting direction is directed toward the first substrate and the thin film battery is made of a transparent material.

According to another exemplary embodiment, the display device comprises a plurality of thin film batteries which are connected in series or in parallel with each other.

According to another exemplary embodiment, the display device comprises one thin film battery whose area is equal to that of the OLED device.

According to another exemplary embodiment, the display device further comprises a buffer layer formed between the thin film battery and the first substrate.

According to another exemplary embodiment, the thin film battery comprises a cathode collector, a cathode, a solid electrolyte layer, an anode and an anode collector, which are arranged successively, and the thin film battery further comprises an insulating layer for packaging the cathode, the solid electrolyte layer and the anode and for isolating the cathode collector from the anode collector.

Compared with the display device with a lithium battery in the prior art, the thickness of the display device can be greatly reduced by employing the OLED display device integrated with a thin film battery according to the embodiment of the present disclosure; and compared with the display device integrated with a solar battery in the prior art, battery performance and endurance of electronics of the OLED display device according to the embodiments of the present application may be significantly improved, and the application area is enhanced, without being subjected to lighting conditions.

At the same time, as the thin film battery are located at the bottom of the OLED device, the range of selecting the material of the thin film battery is relatively widened. It is not necessary to use transparent metals such as ITO. This can bring about at least two advantages: (1) the performance of the thin film battery may be improved; and (2) the light path of the light emitted from the OLED device will not be blocked by the thin film battery, so that the brightness of the OLED display device is higher when being viewed from the outside.

BRIEF DESCRIPTION OF THE DRAWINGS

In order to illustrate the technical solution of the embodiments of the present invention more clearly, the accompanying drawings of the embodiments will be briefly described below. It will be apparent that the drawings described below only relate to some embodiments of the present invention, and are not intended to limit the scope of the present invention.

DETAILED DESCRIPTION OF PREFERRED EMBODIMENTS OF THE INVENTION

Exemplary embodiments of the present disclosure will be described hereinafter in detail with reference to the attached drawings, so that the objects, technical solutions and advantages of the embodiments of the present invention will become more apparent. Obviously, the described embodiments are merely a part of the embodiments of the present invention, but not all embodiments. Based on the described embodiments of the present invention, all other embodiments obtained by those of ordinary skill in the art without creative efforts will fall within the scope of the present invention.

Figure 1:
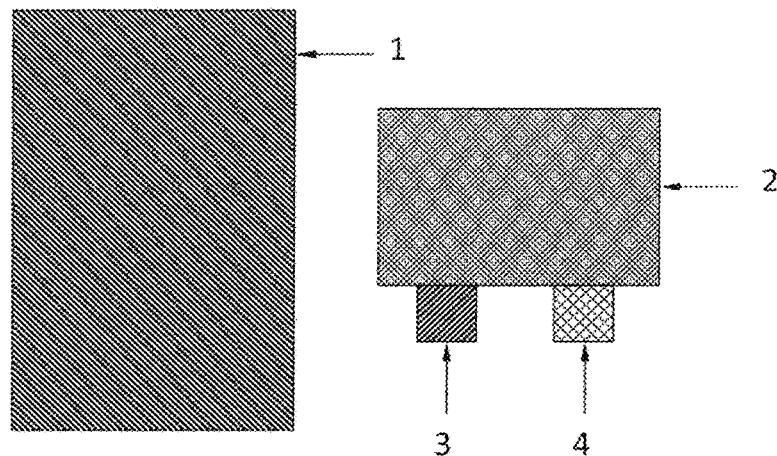
FIG. 1 is a schematic view of a known display device.
Figure 2:
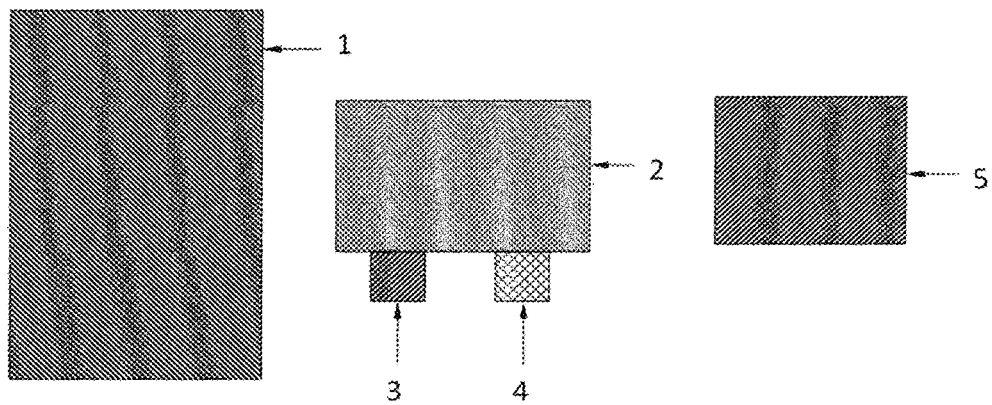
FIG. 2 is a schematic view of another known display device.
Figure 3:
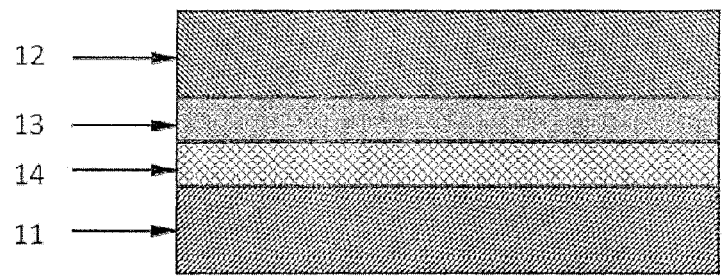
FIG. 3 is a schematic view of a display device according to an exemplary embodiment of the present disclosure.

FIG. 3 is a schematic view of a display device according to an exemplary embodiment of the present disclosure. The display device is an OLED display device. As shown in FIG. 3, the OLED display device comprises: a first substrate 11, a second substrate 12, and an OLED device 13 formed between the first and second substrates 11, 12. Usually, the first substrate 11 is used for forming the OLED device 13 and the thin film battery 14 thereon, and the second substrate 12 is used for packaging and protecting the OLED device 13 and the thin film batteries 14.

The OLED device used in the embodiment of the present disclosure may be a conventional OLED device, which comprises for example a plurality of thin film transistors, a plurality of capacitors, an anode, an OLED light emitting layer and a cathode. Since the basic structure of an OLED device is known to those skilled in the art, it will not be specifically described here.

As shown in FIG. 3, the thin film battery 14 is provided below or at the bottom of the OLED device 13. Here, the term "below" or "bottom" is referred to with respect to the light emitting direction of the OLED device 13, which means that the thin film battery 14 is provided on a side of the OLED device 13 in a direction opposite to the light emitting direction. For example, in the embodiment shown in FIG. 3, the light emitting direction of the OLED device 13 is the upward direction in the drawing. Further, the OLED device is chosen as a top light emitting device. Since the OLED device is an active light emitting device, which doesn't need a backlight source, addition of thin film battery will not block the light emitted from the OLED.

By arranging the thin film battery 14 and the OLED device 13 in this manner, the thin film battery 14 does not block the light emitted from the OLED device 13, thus it will not adversely affect the brightness of the screen of the display device when viewed from the outside. In addition, by arranging the thin film battery 14 and the OLED device 13 in this manner, the materials of various layers of the thin film battery are not necessarily selected from the transparent materials. So the thin film battery may be manufactured by using other non-transparent materials with higher efficiency and/or lower cost, then performance and the efficiency of the thin film battery can be improved correspondingly.

Of course, the thin film battery 14 may also be provided on top of or above the OLED device 13, as will be readily appreciated by those skilled in the art. Under this situation, it is necessary to form a thin film battery 14 with a transparent material or a material with high transparency.

Figure 4:
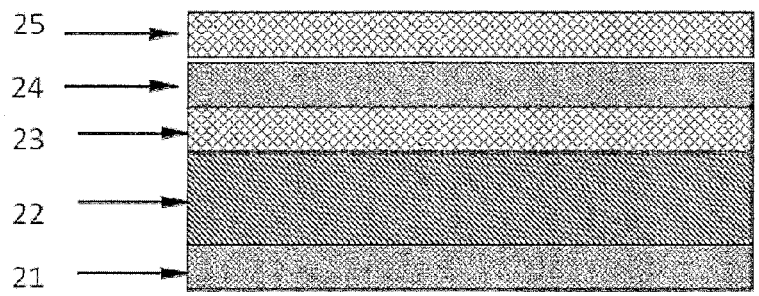
FIG. 4 is a schematic view of the structure of a thin film battery.

FIG. 4 is a schematic view of the structure of a typical thin film battery. As shown in the Figure, the thin film battery has a multilayer structure including a cathode collector 21, a cathode 22, a solid electrolyte layer 23, an anode 24 and an anode collector 25, which are arranged on a substrate (not shown in the Figure) successively. As the thin film battery is a multilayer structure as a whole, it may be compatible with the manufacturing process of the OLED display panel.

In accordance with the type of electrolyte, thin film batteries can basically be classified into three types: liquid electrolyte thin film batteries, solid electrolyte thin film batteries (all-solid-state thin film batteries) and gel electrolyte thin film batteries. The all-solid-state thin film batteries have an inherent advantage that they don't dry or leak and can be safely applied to various electronic elements. The all-solid-state thin film batteries has limited ion diffusion coefficient, so they usually work better at a higher temperature.

The inventor of the present application found that, as the manufacturing process of the thin film battery may be compatible with that of the panel, application of a thin film battery to a display panel may be achieved in a convenient manner in terms of manufacture. At the same time, the temperature of the display device will rise when it works, which contributes to a better performance of the all-solid-state thin film battery. Therefore, an all-solid-state thin film battery is chosen as the thin film battery 14.

Figure 5:
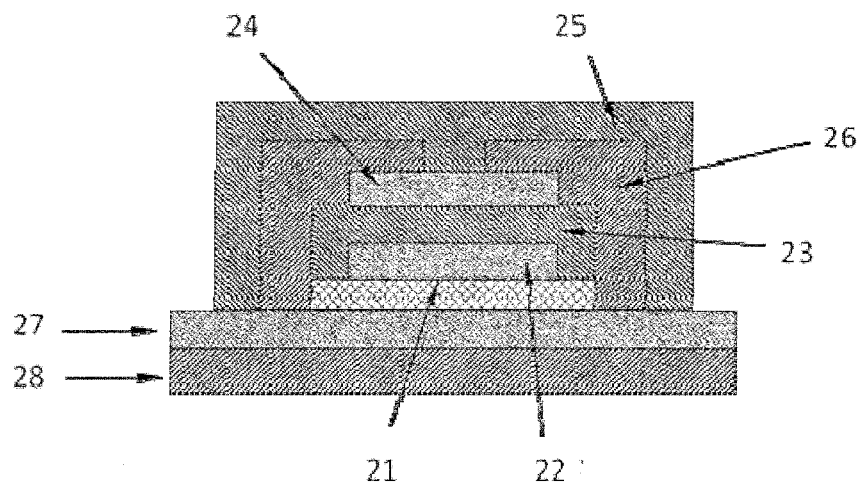
FIG. 5 is a schematic view of the structure of an exemplary thin film battery which can be applied to the display device of the present disclosure.

FIG. 5 shows a schematic view of a configuration of an exemplary thin film battery which can be applied to the display device of the present disclosure. As shown in FIG. 5, the thin film battery comprises a buffer layer 27 arranged on the substrate 28, as well as a cathode collector 21, a cathode 22, a solid electrolyte layer 23, an anode 24 and an anode collector 25. It is known to those skilled in the art that the buffer layer 27 is optional, which can be provided as desired. In addition, the thin film battery further comprises an insulating layer 26 which is arranged outside the cathode 22, the solid electrolyte layer 23 and the anode 24 so as to package the cathode 22, the solid electrolyte layer 23 and the anode 24 and to isolate the cathode collector 21 from the anode collector 25. When such a thin film battery is applied to a display panel or such a thin film battery is manufactured during manufacturing the display panel, the substrate 28 of the thin film battery may be used as the first substrate 11 in the embodiment illustrated in FIG. 3, or the substrate 28 of the thin film battery may be used as the first substrate 11 of the display panel.

As an example, the anode 24 may be formed of metal lithium, the solid electrolyte layer 23 may be formed of lithium nitride phosphate (LiPON), the cathode 22 may be formed of lithium cobaltate, the cathode collector 21 may be formed of metal aluminum, the anode collector 25 may be formed of metal copper, and the buffer layer 27 and the insulating layer 26 may be made of an insulating material such as silicon nitride or silicon oxide.

A basic unit size of the thin film battery shown in the schematic view of FIG. 5 may be set to a macroscopic level or a microscopic level. For example, the area or size of the thin film battery may equal to the area or size of the display area of the OLED device (as shown in FIG. 3) or equal to the area or size of several OLED pixels of the OLED device.

Optionally, a basic unit of the thin film battery is in a microscopic level. By providing a thin film battery in this manner, the thin film battery can provide a higher current density. Under this situation, a plurality of thin film batteries are provided below the OLED device, and these thin film batteries can be arranged in series (not shown), so that a large output voltage can be provided.

Figure 6:
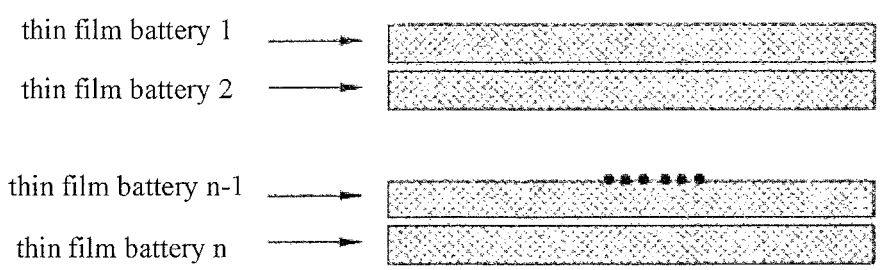
FIG. 6 is a schematic view of the thin film batteries arrangement in parallel.

The plurality of thin film batteries may be arranged in parallel. As shown in FIG. 6, n (n≥2) thin film batteries are arranged in parallel. With such an arrangement, a larger output current can be provided.

Figure 7:
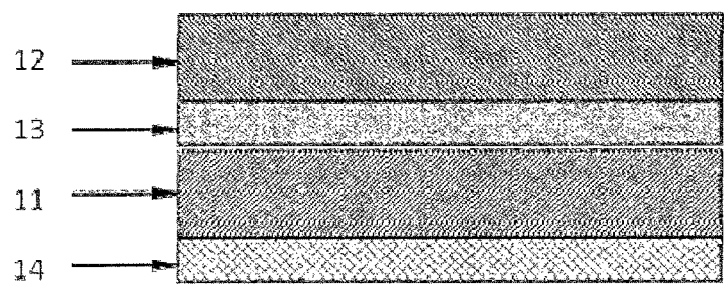
FIG. 7 is a schematic view of a display device according to another exemplary embodiment of the present disclosure.

FIG. 7 is a schematic view of a display device according to another exemplary embodiment of the present disclosure. The embodiment shown in FIG. 7 is substantially the same as that shown in FIG. 3 in structure, except that the thin film battery 14 is arranged below the first substrate 11. By adopting this structure, the thin film battery 14 is isolated from the OLED device 13 by the first substrate 11, so that the influence of the thin film battery 14 on the operation or manufacturing process of the OLED device 13 can be reduced. In the embodiment, The light emitting direction of the OLED device 13 is directed upward in the drawing and the thin film battery 14 is formed below the first substrate 11 that is in a direction opposite to the light emitting direction of the OLED device 13.

The manufacturing process of an OLED display device with an all-solid-state thin film battery will be readily understood by those skilled in the art by understanding the display device according to the exemplary embodiments of the present disclosure.

Specifically, as for the embodiment illustrated in FIG. 3, the manufacturing process may comprise the exemplary steps as follows:

Step One: forming a thin film battery 14 on a first substrate 11 with a semiconductor manufacturing process. The thin film battery may be in a form of a single thin film battery or in a form of a plurality of thin film batteries connected in series, or in parallel, or in a hybrid form of series connection and parallel connection;

Step Two: forming an OLED device 13 above the thin film battery 14. The OLED device may comprise a plurality of thin film transistors, a plurality of capacitors, an anode, and an OLED light emitting layer and a cathode and so on;

Step Three: packaging the first substrates 11 on which the thin film battery 14 and the OLED device 13 are formed and the second substrate 12, the thin film battery 14 and the OLED device 13 being packaged between the first and second substrates 11, 12, the OLED device 13 being configured such that the light emitting direction thereof is directed toward the second substrate 12, and the thin film battery is formed of a non-transparent material, or the OLED device 13 being configured such that the light emitting direction thereof is directed toward the first substrate 11, and the thin film battery is formed of a transparent material.

As for the embodiment illustrated in FIG. 7, the manufacturing process may comprise the exemplary steps as follows:

Step One: forming a thin film battery 14 on a first side of a first substrate 11 with a semiconductor manufacturing process. The thin film battery may be in a form of a single thin film battery or in a form of a plurality of thin film batteries connected in series, or in parallel, or in a hybrid form of series connection and parallel connection;

Step Two: forming an OLED device 13 on a second side opposite to the first side of the first substrate 11. The OLED device may comprise a plurality of thin film transistors, a plurality of capacitors, an anode, an OLED light emitting layer and a cathode and so on;

Step Three: packaging a second substrate 12 onto a side of the first substrates 11 on which the OLED device 13 is formed, such that the OLED device 13 is packaged between the first and second substrates 11, 12 and the thin film battery 14 is located outside of the packaging construction and is isolated from the OLED device 13. The OLED device 13 is configured such that the light emitting direction thereof is directed toward the second substrate 12, and the thin film battery is formed of a non-transparent material, or the OLED device 13 is configured such that the light emitting direction thereof is directed toward the first substrate 11, and the thin film battery is formed of a transparent material.

Compared with the display device with a lithium battery in the prior art, the thickness of the display device can be greatly reduced by employing the OLED display device integrated with a thin film battery according to the embodiment of the present disclosure; and compared with the display device integrated with a solar battery in the prior art, battery performance and endurance of electronics of the OLED display device according to the embodiments of the present application may be significantly improved, and the application area is enhanced, without being subjected to lighting conditions.

At the same time, as the thin film battery are located at the bottom of the OLED device, the range of selecting the material of the thin film battery is relatively widened. It is not necessary to use transparent metals such as ITO. This can bring about at least two advantages: (1) the performance of the thin film battery may be improved; and (2) the light path of the light emitted from the OLED device will not be blocked by the thin film battery, so that the brightness of the OLED display device is higher when being viewed from the outside.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An OLED display device with a thin film battery, comprising:
   a first substrate,
   a second substrate arranged to be opposite to the first substrate, and
   an OLED device formed between the first and second substrates,
   wherein the display device further comprises at least one thin film battery formed on the first substrate; and
   the thin film battery is formed on a side of the first substrate, and the side of the first substrate is facing away from the OLED device.

2. The display device according to claim 1,
   wherein the thin film battery is an all-solid-state thin film battery.

3. The display device according to claim 1,
   wherein the thin film battery is formed between the first substrate and the OLED device.

4. The display device according to claim 3,
   wherein the OLED device is configured such that its light emitting direction is directed toward the second substrate and the thin film battery is made of a non-transparent material.

5. The display device according to claim 3,
   wherein the OLED device is configured such that its light emitting direction is directed toward the first substrate and the thin film battery is made of a transparent material.

6. The display device according to claim 1,
   wherein the display device comprises a plurality of thin film batteries which are connected in series or in parallel with each other.

7. The display device according to claim 1,
   wherein the display device comprises one thin film battery whose area is equal to that of the OLED device.

8. The display device according to claim 1,
   wherein the display device further comprises a buffer layer formed between the thin film battery and the first substrate.

9. The display device according to claim 1,
   wherein the thin film battery comprises a cathode collector, a cathode, a solid electrolyte layer, an anode and an anode collector, which are arranged successively, and the thin film battery further comprises an insulating layer for packaging the cathode, the solid electrolyte layer and the anode, and for isolating the cathode collector from the anode collector.

10. The display device according to claim 1,
    wherein the OLED device is configured such that its light emitting direction is directed toward the second substrate and the thin film battery is made of a non-transparent material.

11. The display device according to claim 1,
    wherein the OLED device is configured such that its light emitting direction is directed toward the first substrate and the thin film battery is made of a transparent material.

* * * * *